(12) United States Patent
Tourret

(10) Patent No.: US 12,483,240 B2
(45) Date of Patent: Nov. 25, 2025

(54) BIAS CIRCUIT

(71) Applicant: NXP B.V., Eindhoven (NL)

(72) Inventor: Jean-Robert Tourret, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 159 days.

(21) Appl. No.: 18/467,053

(22) Filed: Sep. 14, 2023

(65) Prior Publication Data

US 2024/0113709 A1 Apr. 4, 2024

(30) Foreign Application Priority Data

Sep. 30, 2022 (EP) ..................................... 22306459

(51) Int. Cl.
*H03K 17/687* (2006.01)
*H03K 19/0175* (2006.01)
*H02M 3/155* (2006.01)

(52) U.S. Cl.
CPC . *H03K 17/6871* (2013.01); *H03K 19/017509* (2013.01); *H02M 3/155* (2013.01)

(58) Field of Classification Search
None
See application file for complete search history.

(56) References Cited

U.S. PATENT DOCUMENTS

| 6,556,053 | B2 | 4/2003 | Stanley |
| 9,666,143 | B2* | 5/2017 | Ichikura ................ H03F 1/0205 |
| 9,831,867 | B1 | 11/2017 | Kinzer et al. |
| 9,899,918 | B2* | 2/2018 | Lee ........................ H02M 3/158 |
| 10,013,936 | B2* | 7/2018 | Ahn ....................... G09G 3/3696 |
| 10,224,922 | B1* | 3/2019 | Tiwari ........... H03K 19/018521 |
| 11,057,031 | B1 | 7/2021 | Bagheri et al. |
| 11,646,665 | B2* | 5/2023 | Wu ......................... H02M 1/08 |
| | | | 327/109 |
| 12,212,315 | B1* | 1/2025 | Kumar ................... H03K 3/011 |
| 2007/0183174 | A1 | 8/2007 | Lee |
| 2022/0077776 | A1 | 3/2022 | Saini |

OTHER PUBLICATIONS

Bandyopadhyay et al.: "20 µA to 100mA DC-DC converter with 2.8 to 4.2V battery supply for portable applications in 45nm CMOS," 2011 IEEE International Solid-State Circuits Conference, Feb. 20-24, 2011, DOI: 10.1109/ISSCC.2011.5746365, IEEE, San Francisco, CA, USA, pp. 386-388.

* cited by examiner

*Primary Examiner* — Thomas J. Hiltunen

(57) ABSTRACT

A bias circuit for generating a virtual reference voltage is described. The bias circuit may bias a switching device configured to switch a switching device output between a first and second supply voltage. The bias circuit includes a bias stage coupled between the first supply voltage rail and the second supply voltage rail. The bias stage has a bias stage output configured to output a virtual reference voltage value having a value between the first and second supply voltage. The bias circuit further includes a voltage follower coupled to the bias stage. The voltage follower is configured to output the virtual reference voltage. The bias circuit further includes a first charge pump coupled to the voltage follower output; and at least one of a second charge pump coupled to the bias stage voltage output, and a switchable buffer coupled to the bias stage voltage output and the voltage follower output.

20 Claims, 6 Drawing Sheets

BIAS CIRCUIT

CROSS-REFERENCE TO RELATED APPLICATIONS

This application claims the priority under 35 U.S.C. § 119 of European Patent application no. 22306459.3, filed on 30 Sep. 2022, the contents of which are incorporated by reference herein.

FIELD

This disclosure relates to a bias circuit for generating a virtual earth.

BACKGROUND

In many devices, specific biasing techniques may be required for example in high voltage switching devices when the device maximum ratings are much lower than the supply maximum value.

Integrated circuits (ICs) signal interfaces use voltages, for example 1.8V, 3.3V, 4.2V which are often higher than on-chip voltages to communicate with other ICs.

Advanced process nodes may offer thick oxide devices which enable to withstand 2.5V, 3.3V or higher. These thick oxide devices may be used in IO drivers or inductive DCDC switching stages that can operate directly under the higher supply voltage.

However, not all advanced process nodes offer such high voltage devices. Typically, the baseline components of these processes may generally be operated under a much smaller voltage, for example 0.5V to 1.1V. The baseline components may also include Extended Gate (EG) devices which are able to support intermediate voltages, for example 1.8V which may still be lower than the maximum voltage for communication between ICs. In such nodes, rail to rail stages such as a CMOS driver supplied by the higher voltages are not an option and some more complex circuitry is necessary, for example cascoded switching stages and LDMOS-based switching stages.

SUMMARY

Various aspects of the disclosure are defined in the accompanying claims. In a first aspect there is provided a bias circuit for generating a virtual reference voltage for a switching device configured to switch a switching device output between a first supply voltage and a second supply voltage, the bias circuit comprising: a bias stage coupled between the first supply voltage rail and the second supply voltage rail and having a bias stage voltage output configured to output a bias stage voltage having a virtual reference voltage value having a value between the first and second supply voltage; a voltage follower coupled to the bias stage and configured to follow the bias stage voltage and having a voltage follower output configured to output the virtual reference voltage; a first charge pump coupled to the voltage follower output; and at least one of a second charge pump coupled to the bias stage voltage output, and a switchable buffer coupled to the bias stage voltage output and the voltage follower output.

In one or more embodiments, the virtual reference value may have a value corresponding to the difference between the first supply voltage, and a switch voltage, wherein the switch voltage value is a value between the first and second supply voltage value.

In one or more embodiments, the bias circuit may comprise the second charge pump.

In one or more embodiments, the bias circuit may comprise the switchable buffer.

In one or more embodiments, the switchable buffer may comprise: a first switchable buffer input coupled to the bias stage voltage output; a second switchable buffer input coupled to the voltage follower output; a first and second transconductor stage, each transconductor stage having a first differential input coupled to the first switchable buffer input, and a second differential input coupled to the second switchable buffer input, and a transconductor stage output: wherein the first transconductor stage output is coupled to the control input of a MOS transistor having a first terminal coupled to the second switchable buffer input, and an a second terminal coupled to the second supply voltage rail; and the second transconductor stage output is coupled to the second switchable buffer input.

In one or more embodiments, the first transconductor stage may comprise an unbalanced differential pair of MOS transistors.

In one or more embodiments, each of the first and second transconductor stages may further comprise: a current mirror having a first current mirror branch and a second current mirror branch, and first and second NMOS transistors having a source coupled to the second supply voltage rail, wherein the second current mirror branch is coupled to the transconductor stage output; a differential pair of MOS transistors comprising a first PMOS transistor having a gate coupled to the first differential input and a drain coupled to the first current mirror branch, and a second PMOS transistor having a gate coupled to the second differential input and a drain coupled to the second current mirror branch; a third PMOS transistor having a drain coupled to the sources of the first and second PMOS transistors, a source coupled to a switching voltage supply rail, and a gate configured to receive a bias voltage.

In one or more embodiments, the switchable buffer may further comprise a fourth PMOS transistor having a source coupled to the switching voltage supply rail, a series arrangement of a current source and enable switch coupled between the fourth PMOS transistor gate and drain and the second supply voltage rail.

In one or more embodiments, the bias stage further comprises a first series arrangement of at least one diode-connected NMOS transistor coupled between the first supply voltage rail and the bias stage voltage output, and a second series arrangement of at least one diode-connected NMOS transistor coupled between the second supply voltage rail and the bias stage voltage output.

In one or more embodiments, the first series arrangement and the second series arrangement may comprise the same number of diode-connected NMOS transistors.

In one or more embodiments, the first series arrangement and the second series arrangement may comprise a different number of diode-connected NMOS transistors.

In one or more embodiments, the bias stage may further comprise a first bias capacitor coupled between the first supply voltage rail and the bias stage voltage output and a second bias capacitor coupled between the second supply voltage rail and the bias stage voltage output.

In one or more embodiments, the voltage follower may comprise a voltage follower NMOS transistor having a gate coupled to one of the gates of the first series arrangement of diode-connected NMOS transistors, a source coupled to the voltage follower output and a drain coupled to the first supply voltage rail.

In one or more embodiments, the bias circuit may further comprise a decoupling capacitor coupled between the voltage follower NMOS transistor and the second supply voltage rail.

In one or more embodiments, the bias circuit may further comprise a controller coupled to the first charge pump and the second charge pump and configured to generate a clock signal and an enable signal.

Embodiments of the bias circuit may be included in a switching device. The switching device may further comprise a switching stage configured to switch a switching device output between a first supply voltage and a second supply voltage and comprising: a first supply voltage rail configured to supply the first supply voltage; a second supply voltage rail configured to supply the second supply voltage; a level shifter comprising: a first level shifter input configured to receive an input signal switching between a switch voltage and the second supply voltage; a second level shifter input configured to receive the virtual reference voltage having a virtual reference voltage value corresponding to the difference between the first supply voltage and a switch voltage; a level shifter output configured to output a voltage varying between the virtual reference voltage and the first supply voltage; a PMOS switch transistor having a first PMOS transistor terminal coupled to the first supply voltage rail, a second PMOS transistor terminal coupled to the switching device output and a PMOS control terminal coupled to the level shifter output; a NMOS switch transistor having a first NMOS transistor terminal coupled to the second supply voltage rail, a second NMOS transistor terminal coupled to the switching device output and a NMOS control terminal coupled to the first level shifter input.

In one or more embodiments of the switching device, the gate source voltage of the PMOS and NMOS switch transistors is less than the switch voltage value.

One or more embodiments of the switching device may further comprise a cascode PMOS transistor arranged between the PMOS switch transistor and the switching device output and cascode NMOS transistor arranged between the NMOS switch transistor and the switching device output.

One or more embodiments of the switching device may be included in a DC-DC converter.

One or more embodiments of the switching device may be included in an input output (I/O) driver.

BRIEF DESCRIPTION OF THE DRAWINGS

In the figures and description like reference numerals refer to like features. Embodiments are now described in detail, by way of example only, illustrated by the accompanying drawings in which.

Figure 1:
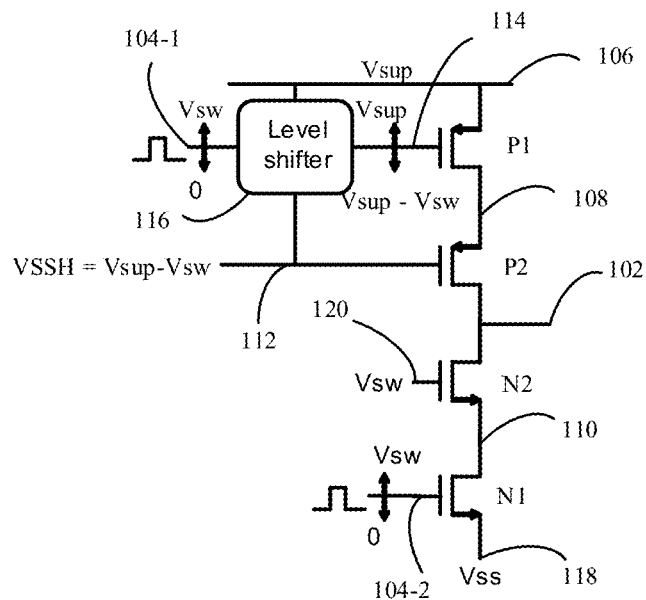
FIG. 1 shows a typical cascode I/O switch circuit including a level shifter.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows a typical cascode I/O switching stage 100 including a level shifter 116. A first voltage supply rail 106 is connected to the level shifter and a source of a first PMOS transistor P1. A level shifter output 114 is connected to the gate of the first PMOS transistor P1. Circuit node 108 is connected to a drain of PMOS transistor P1 and source of a second PMOS transistor P2. A second voltage supply rail 118, typically a ground is connected to a source of a first NMOS transistor N1. Circuit node 110 is connected to the drain of the first NMOS transistor N1 and the source of a second NMOS transistor N2. The switch circuit output 102 is connected to a drain of the second PMOS transistor P2 and a drain of a second NMOS transistor N2. A first input 104-1 of the switching stage 100 is connected to the level shifter input. A second input 104-2 of the switching stage 100 is connected to the gate of the first NMOS transistor N1. In some examples, the inputs 104-1, 104-2 may receive the same input signal. A virtual ground supply 112 is connected to the level shifter 116 and the gate of the second PMOS transistor P2. A switch voltage supply 120 is connected to the gate of the second NMOS transistor N2. The switch voltage supply has a switch voltage level Vsw which is less than the voltage of the first supply rail Vsup.

Figure 2:
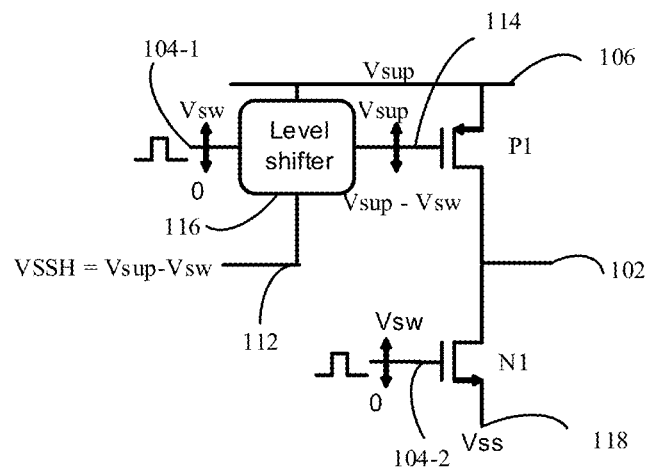
FIG. 2 illustrates a I/O LDMOS switch circuit including a level shifter.

FIG. 2 shows a typical I/O switching stage 130. The PMOS transistor P1 and the NMOS transistor N1 are implemented as LDMOS transistors. The second PMOS and NMOS transistors P2, N2 are omitted compared to cascode switching stage 100.

Figure 3:
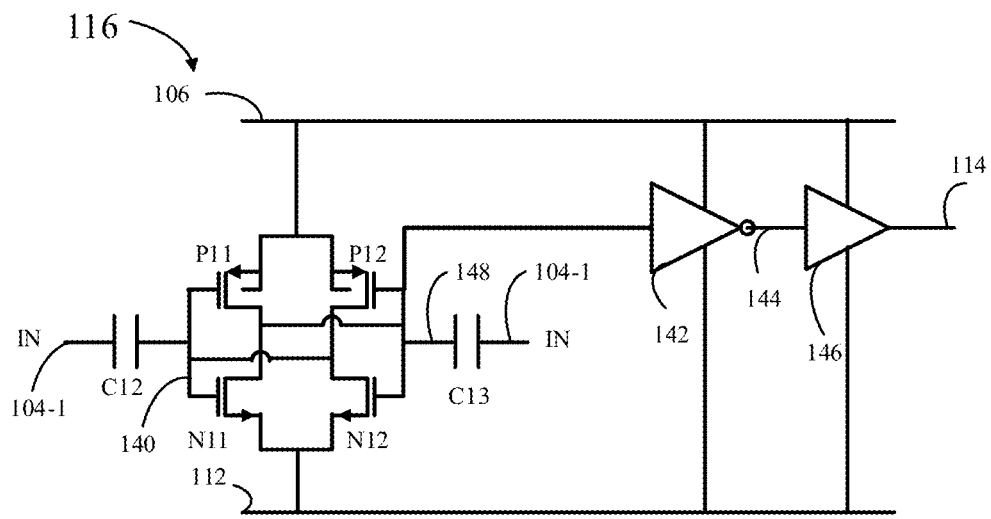
FIG. 3 shows an example implementation of a level shifter for the I/O switch circuits of FIG. 1 and FIG. 2.

FIG. 3 shows an example implementation of a level shifter 116 for switching stages 100, 130. A virtual ground 112 is connected to the sources of NMOS transistors N11, N12. Node 140 is connected to the gates of PMOS transistor P11 and NMOS transistor N11 and the drains of PMOS transistor P12 and NMOS transistor N12. Node 148 is connected to the gates of PMOS transistor P12 and NMOS transistor N12 and the drains of PMOS transistor P11 and NMOS transistor N11. The sources of PMOS transistors P11 and P12 are connected to the first supply rail 106. Capacitor C11 is connected between the switch circuit input 104-1 and node 140. Capacitor C12 is connected between the switch circuit input 104-1 and node 148. Node 148 is connected to the input of an inverter 142. The inverter output 144 is connected to the input of buffer 146. The output of the buffer 146 is connected to the level shifter output 114.

During the operation of switching stages 100,130, the incoming signal for example a driving clock signal toggles between 0 and the switch voltage Vsw. The voltage VSSH is a virtual ground defined as VSSH=Vsup−Vsw. At this stage, VSSH is assumed to be available and generated from any voltage source.

The switch voltage Vsw is the maximum allowable voltage in the process node, for example 1.8V for EG devices in 28FDSOI. The switch voltage Vsw defines the virtual ground target as Vsup−Vsw which keeps the gate source voltage of PMOS transistor P1 Vsg(P1)<Vsw. For any of the transistors P1, P2, N1, N2, the gate to source voltage cannot exceed Vsw. The voltage Vsw is generally a fixed voltage from a low drop out (LDO) regulator and is generally the maximum supported voltage for a given device type, for example 1.8V for EG devices in 28fdsoi process node. Hence, the high-side PMOS P1 can be switched between Vsup and Vsup−Vsw. For the cascoded P-type device P2, VSSH is also the optimal value for the cascode gate voltage and the virtual ground for the level shifter.

In any of these switch circuits 100, 130, the virtual ground VSSH will tend to bounce during the PMOS devices switching because of the time taken for parasitic capacitors associated with P1 and P2 to charge. The consequence of this is that VSSH will deviate for a moment from its optimal value, typically to a higher value. Hence the transistors may not be protected against a large supply voltage Vsup which exceeds the transistor device rating. In addition, the output drive power of the PMOS transistor P1 may be smaller than expected, due to a smaller gate source voltage $V_{SG}$ (Vsup−Vsw).

For either of switch devices 100, 130, the generation of a virtual ground VSSH may require a strong (large) decoupling cap on the VSSH node 112, and active biasing to ensure a safe and strong drive of the switching stage.

Figure 4:
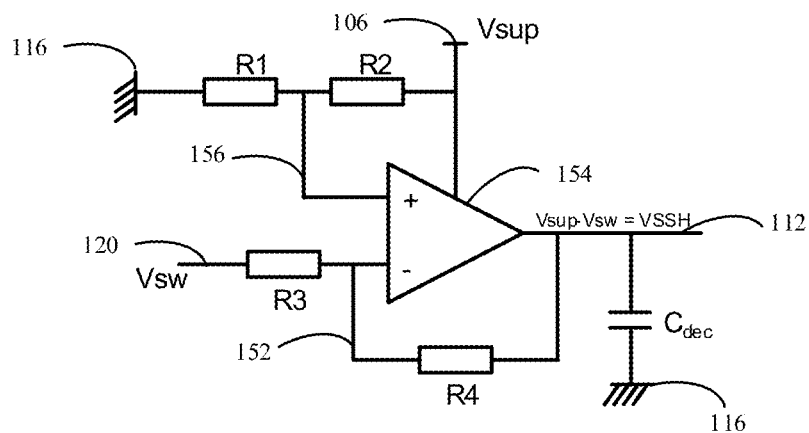
FIG. 4 illustrates a bias circuit to generate a virtual ground for the switch circuits of FIGS. 1 and 2.

FIG. 4 shows a typical bias generation circuit 150 which may be used to generate the virtual ground reference VSSH in switch devices 100, 130. The bias generation circuit 150 includes an amplifier 154 connected to the first supply voltage rail 106. First and second resistors R1, R2 are connected in series between the first supply voltage rail and the second supply voltage rail 118 which may be a ground. A common node between the first and second resistors R1, R2 is connected to a noninverting input 156 of the amplifier 154. A third resistor R3 is connected between the switch supply voltage rail 120 and a noninverting input 152 of the amplifier 154. A fourth resistor R4 is connected between the inverting input 152 and the amplifier output. The amplifier output is connected to the virtual ground reference node 112. A decoupling capacitor $C_{dec}$ is connected between the virtual ground reference node 112 and the second supply rail 118.

In operation, the virtual ground VSSH is maintained at a voltage Vsup−Vsw by a transconductor loop which requires a significant amount of quiescent current and consequently power consumption. A large amount of capacitive decoupling is also necessary, generally in proportion to the actual parasitic capacitor represented by the cascode and/or the switching stage. The amplifier 154 is an Operational Transconductance Amplifier (OTA) and provides the current to decoupling capacitor Cdec when VSSH bounces high or low. In order to minimize the time during which VSSH deviates significantly from its optimal value, both Cdec and the OTA quiescent current need to be relatively large. In some cases, Cdec may have a value of several hundreds of pF and consequently is implemented as a capacitor external to the IC.

Some current also has to flow into resistors R3, R4 from Vsw to VSSH both to minimize the area and to make sure that the OTA dominant pole does not depend significantly on secondary poles.

Figure 5:
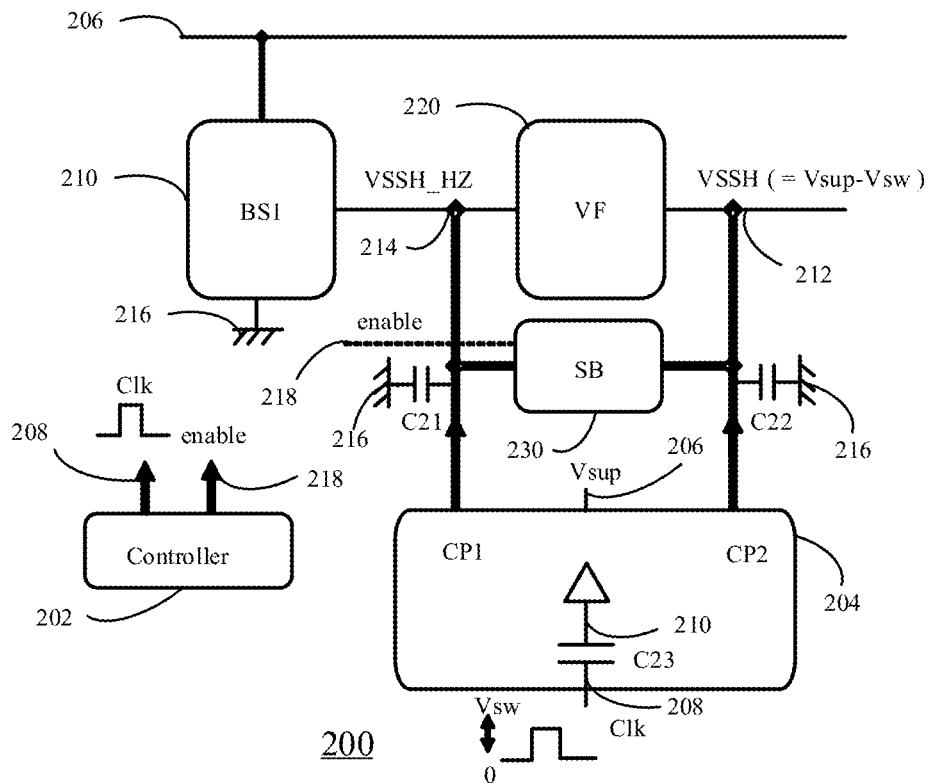
FIG. 5 shows a bias circuit for generating a virtual ground according to an embodiment.
Figure 6:
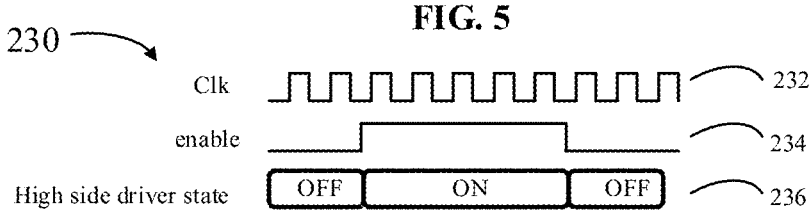
FIG. 6 shows example timing waveforms for the bias circuit of FIG. 5.

FIG. 5 shows a bias circuit 200 for generating a virtual ground according to an embodiment. A bias stage 210 is connected to a first voltage supply rail 206 and a second voltage supply rail 216. The bias stage output 214 is connected to a voltage follower 220, a switchable buffer 230 and a charge pump output of first charge pump CP1 in charge pump circuit 204. The bias circuit output 212 is connected to the switchable buffer 230, a charge pump output of second charge pump CP2 in charge pump circuit 204, and the output of the voltage follower 220. A first capacitor C21 is connected between the bias stage output 214 and the second voltage supply rail 216 which may be a ground. A second capacitor C22 is connected between the bias circuit output 212 and the second voltage supply rail 216. A controller 202 may generate a clock signal on clock output 208 and an enable signal for the switchable buffer 230 on the enable output 218. A third capacitor C23 is connected between the clock output 208 and clock input 210 of the charge pumps 204. The buffer of the switchable buffer 230 may have a voltage input and a current output and may be implemented using a transconductance amplifier FIG. 6 shows an example waveforms 230 generated by the controller 202. The clock signal 232 as well as being provided to the charge pumps may also be used as an input two for examples the switch device cascode 100. The enable signal may be generated dependent on the high side drive estate i.e. whether the transistor P1 is on an off as shown by timing waveform 236.

The biasing stage 210 has almost zero-quiescent current, which generates a consequently high impedance virtual ground VSSH_HZ. The biasing stage 210 may start-up the system and keep all the devices within their safe operating region. The voltage follower 220 without biasing current, may generate a high impedance copy VSSH from VSSH_HZ. The first charge pump CP1 continuously maintains VSSH_HZ to the desired voltage (and thus lowers its dynamic impedance). The second charge pump CP2 may continuously maintain VSSH to the desired voltage (and thus lowers its dynamic impedance). Any bouncing of VSSH is continuously corrected by the actions of the two charge pumps CP1, CP2. The switchable buffer 230 which may for example be implemented as transconductance amplifier or other suitable circuit, may activated prior any expected bouncing of VSSH, which actively holds VSSH when the output stages switch. The switchable buffer 230 may be a unity gain buffer.

The clock period of the charge pumps CP1, CP2 may be adapted to the amount of switching activity i.e. a relatively large clock period when the activity is small, and a smaller period when the activity is large. In some examples, for example an IO buffer configured as an input, a switching activity detector to detect the external signal activity may be included (not shown)

In some examples the second charge pump CP2 may be omitted. Alternatively in other examples, the switchable buffer 230 may be omitted depending on the application The controller 202 may include a low power and low frequency oscillator, whose current consumption is small enough compared to the total desired consumption. The controller 202 provides the clock to the charge pumps. A low frequency clock, with a very low quiescent current, may be provided to the first charge pump CP1 to maintain VSSH_HZ to the required level.

The controller 202 may include a large to very large frequency clock source for the charge pumps Cp1, Cp2 during the switching activity. The second charge pump CP2 may use this higher frequency clock, to speed up the process of recovering VSSH to the VSSH_HZ level. Note that VSSH is pumped high when the pass device of an output stage turns on, for example PMOS device P1 of output stage 100. To benefit from the lowest on-resistance of this device P1, VSSH must recover to the required value as quickly as possible by including one or both of the second charge pump CP2 and the switchable buffer 230. Increasing the clock frequency applied to the second charge pump CP2, may improve the recovery time of VSSH.

FIG. 6 shows an example waveforms 230 generated by the controller 202. The clock signal 232 as well as being provided to the charge pumps CP1, CP2 may also be used as an input to for example the switch device cascode 100. The enable signal 234 may be generated dependent on the high side drive estate i.e. whether the transistor P1 is on or off as shown by timing waveform 236.

Figure 7:
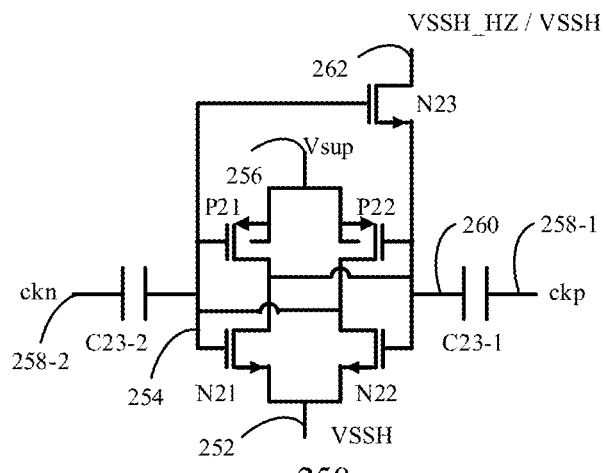
FIG. 7 illustrates an example implementation of a charge pump for the bias circuit of FIG. 5.

FIG. 7 shows an example implementation of a charge pump 250 which may be used to implement charge pumps CP1 and CP2 in bias circuit 200. Node 252 may be connected to the virtual ground 212 and connected to the sources of NMOS transistors N21, N22. Node 254 is connected to the gates of PMOS transistor P21 and NMOS transistor N21 and the drains of PMOS transistor P12 and NMOS transistor N12. Node 260 is connected to the gates of PMOS transistor P22 and NMOS transistor N22 and the drains of PMOS transistor P21 and NMOS transistor N21. The sources of PMOS transistors P21 and P22 are connected to the first supply rail 256. Capacitor C23-1 is connected between a first charge pump clock input 258-1 and node 260. Capacitor C23-2 is connected between a second charge pump clock input 258-2 and node 254. Node 260 may be connected to the source of NMOS transistor N23. The drain of NMOS transistor N23 is connected to the charge pump output 262. The charge pump output 262 may be connected to either node 212 (for CP2) or node 214 (for CP 1). In operation, the first charge pump clock input 258-1 may be supplied by a clock clkp and the second charge pump clock input may be supplied by an inverse clock clkn. The clocks clkp and clkn may be non-overlapping. The charge pump operates a two-step charge transfer from C23-1 which may be referred to as the transfer capacitor to a load capacitor (not shown) connected to the charge pump output 262, for example load capacitor C21.

In step 1, the transfer capacitor C23-1 is charged to Vsw by clock clkp. During this step, a low impedance at both terminations of the capacitor C23-1 is required, and the NMOS switch N23 is open. At this step the voltage at node 260 may have a value of Vsup and the node 254 has a voltage of −Vsw In step 2, the voltage at node 260 may shift from Vsup to Vsup−Vsw on a negative edge of clock clkp and transfer charge C23-1*(Vsup-Vsw) to a load capacitor. During this step, a high impedance is needed on the drain of PMOS transistor P22 to maximize the charge transfer to the load and minimize the losses.

Capacitor C23-2 does not operate any charge transfer, and so can be very small sized with respect to other parasitics. By having non-overlapping clocks clkp, clkn, charge stored in C23-1 is not lost at the beginning of the charge transfer. NMOS transistors N21, N22 may improve the gain of the charge pump 250 but in some examples may be omitted.

Figure 8:
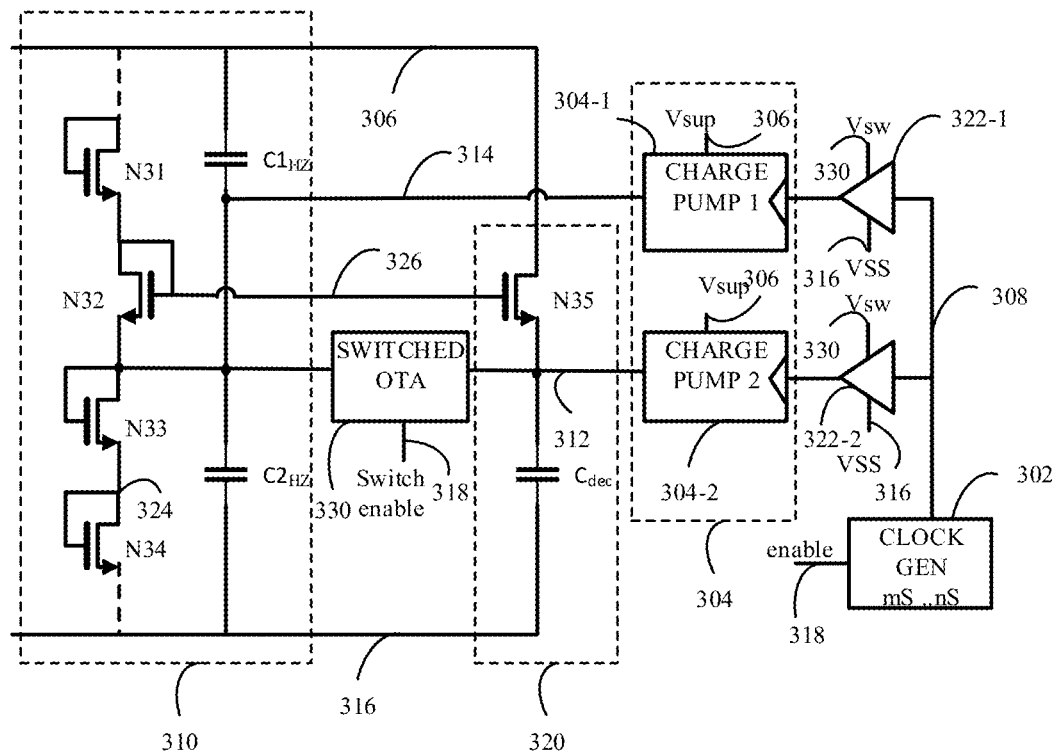
FIG. 8 shows a bias circuit for generating a virtual ground according to an embodiment.

FIG. 8 shows a bias circuit 300 for generating a virtual ground according to an embodiment. A bias stage 310 is connected to a first voltage supply rail 306 and a second voltage supply rail 316. The bias stage 310 includes a first series of diode-connected transistors N31 and N32 connected between the first voltage supply rail 306 and bias stage output 314. Two transistors N31 and N32 are illustrated, but in general there may be one or more transistors. The bias stage 310 includes a second series of diode-connected transistors N33 and N34 connected between the second voltage supply rail 316 and bias stage output 314. Two transistors N33 and N34 are illustrated having node 324 connecting the source of transistor N33, and the gate and drain of N34, but in general there may be one or more transistors. In some examples the number of diode-connected transistors may be the same in the first series and the second series. In other examples the numbers may be different. The diode-connected transistors N31, N32, N33, N34 may be referred to as a diodes bridge. The bias stage output 314 is connected to a voltage follower 320 via node 326, a switchable buffer 330 and a charge pump output of the first charge pump 304-1 in charge pump circuit 304. The bias stage 310 may further include a first capacitor $C1_{Hz}$ connected between the bias stage output 314 and the first supply rail 306. The bias stage 310 may further include a second capacitor $C2_{Hz}$ connected between the bias stage output 314 and the first supply rail 306.

The voltage follower 320 may have a voltage follower transistor N35 having a drain connected to the first voltage supply rail 306 and a gate connected to the gate of the final transistor N32 of the first series of diode-connected transistors. The source of the voltage follower transistor is connected to the bias circuit output 312.

The bias circuit output 312 is connected to the switchable buffer 330 and a charge pump output of second charge pump 304-2 in charge pump circuit 304. A decoupling capacitor Cdec may be connected between the bias circuit output 312 and the second voltage supply 316. A controller 302 may generate a clock signal on clock output 308 and an enable signal for the switchable buffer 330 on the enable output 318. Clock output 308 may be connected to an input of respective clock buffers 322-1, 322-2. The clock buffer outputs may be connected to respective clock inputs of the charge pumps 304-1, 304-2.

All illustrated capacitors may preferably have values in the range of 1 to 100 pF range or other values suitable for on-chip capacitors. As illustrated, the first series and second series of diode-connected transistors have an equal number of transistors and the first and second capacitors C1HZ, C2HZ are equal values. For this implementation, the first supply rail voltage, Vsup, the range is [Vsw . . . 2*Vsw]. If Vsup becomes larger than 2*Vsw, then the diodes bridge can be implemented as an unbalanced bridge with a smaller number of diodes between VSSH_HZ and VSS and capacitors C1HZ, and C2HZ may have different values. In some examples, the cascoded output stage may make use of LDMOS devices which support at least Vsup, the diodes bridge may drain as little DC current as possible, otherwise the charge pumps are not able to maintain Vsup-Vsw on the nodes VSSH_HZ and VSSH. The bridge formed by the C1HZ and C2HZ capacitors may enable a fast settling of VSSH_HZ to the targeted voltage Vsup/2 (or lower, if needed). The virtual earth voltage VSSH then follows due to the voltage follower N35.

The charge pumps and the level shifter are preferably dynamic stages for example as implemented by charge pump 250, and level shifter 200. Having dynamic stages may make the supply domains separation easier than with DC coupled implementation. The memory effect of the latches in charge pump 250 and level shifter 200 may allow DC operation which may be required for example for I/O state retention. The bias circuit 300 may minimize VSSH bouncing when a high side driver of an output stage, for example transistor P1 in switching stages 100, 130 turns on by first charge pump 304-1 maintaining VSSH_HZ to its target [Vsup−Vsw], second charge pump 304-2 keeps maintaining VSSH to its target voltage of Vsup−Vsw and the switchable buffer 330 pulls down VSSH when enabled. This may improve the VSSH recovery time from voltage bouncing during switching to maintain the desired value of VSSH.

Figure 9:
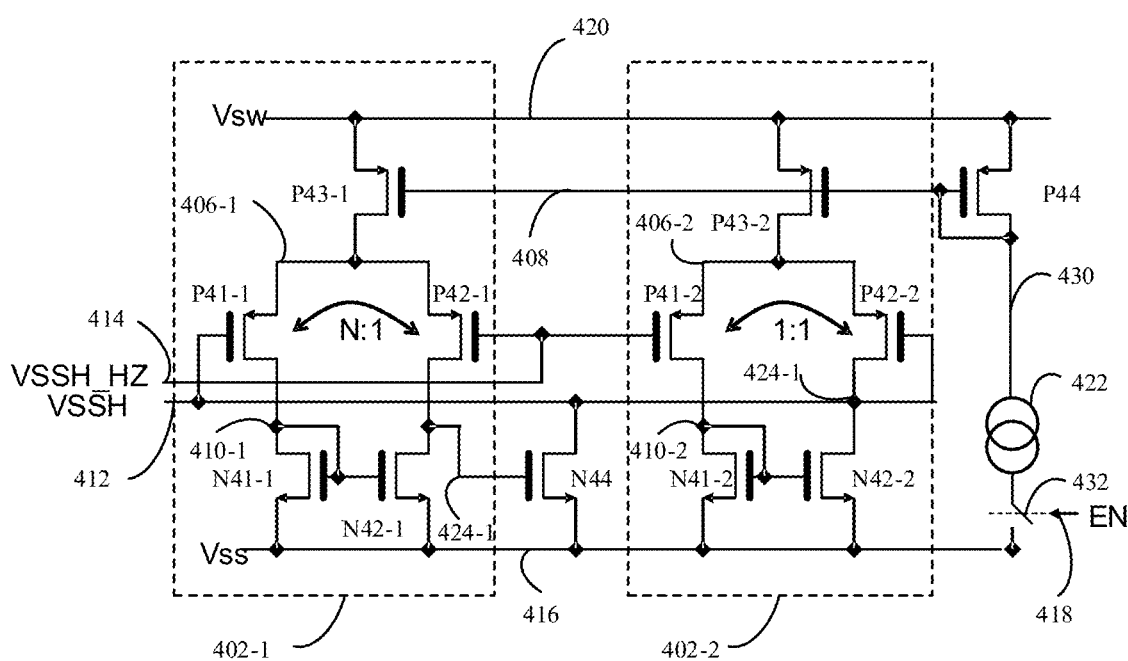
FIG. 9 shows an example implementation for a switched operational transconductance amplifier of the bias circuit of FIG. 8.

FIG. 9 shows an example implementation of a switchable buffer 400 which may be used for example to implement switchable buffers 230, 330. The switchable buffer includes a first transconductor 402-1 which may also be referred to as a pull-down transconductor and a second transconductor 402-2 which may be referred to as a linear transconductor. The first transconductor 402 has a differential pair of PMOS transistors P41-1, P42-1. Node 406-1 is connected to the sources of PMOS transistors P41-1, P42-1 and the drain of bias PMOS transistor P43-1. The source of PMOS transistor P43-1 is connected to the switch voltage supply rail 420. A current mirror formed by NMOS transistors N41-1, N42-1 is connected to the differential pair of PMOS transistors P41-1, P42-1. The differential pair may be an N:1 unbalanced differential pair. The sources of NMOS transistors N41-1, N41-2 are connected to the second voltage supply rail 416 (316, 216) which may be a ground. Node 410-1. The gates of the differential pair of PMOS transistors P41-1, P42-2 are connected respectively to the bias circuit output 412 (312, 212) and the bias stage output 414 (314, 214). The transconductor stage output 424-1 of the first transconductor stage 402-1 is connected to the gate of a NMOS pull-down transistor N44. The source of the pull-down transistor N44 is connected to the second supply rail 416 and the drain of the pull-down transistor N44 is connected to the bias circuit output 412.

The second transconductor 402-2 is similar to the first transistor stage with the exception that the gate of the PMOS transistor P41-2 is connected to the output 424-1 of the second transconductor 402-2. The PMOS transistors P41-2, P42-2, P43-2, NMOS transistors N41-1, N41-2 nodes 406-2 and 410-2 correspond to the equivalent references of the first transconductor 402-1.

Bias transistor P44 may have a source connected to the switch voltage supply rail 420. The gate and drain of the bias transistor P44 nay be connected to circuit node 430. A current source 422 may be connected between the circuit node 430 and a second voltage supply rail 416 via switch 432 controlled by an enable input 418.

When a switching activity is detected or when a controller in the system indicates an activity begins, the switchable buffer 400 (OTA) is enabled. The switchable buffer 400 operates in two steps: First, when VSSH bounces up corresponding to transistor P1 in output stage 100 strongly switching, the first transconductor 402-1 rapidly counteracts to bring down VSSH to a voltage close to VSSH_HZ, but a bit larger. This is obtained due to the unbalanced differential pair P41-1, P41-2 which are dimensioned to have an N:1 ratio. The equivalent gm of this stage is high in order to have a very fast pull down phase. The second transconductor brings VSSH to equal VSSH_HZ with a small gm, which may be relatively easy to stabilize.

Switchable buffer 400 is an example of one possible implementation among others. It will be appreciated that in other examples, different implementations may be used depending on the required OTA turn-on time, DC current consumption, mixed gain, or any other analog parameter for a specific application.

Figure 10:
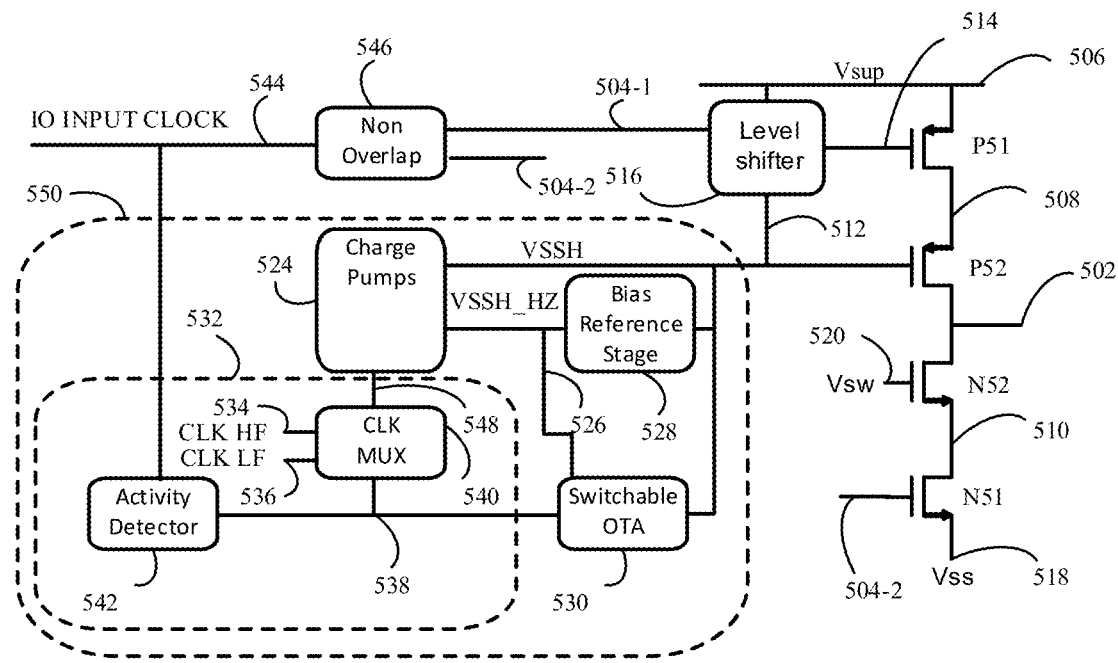
FIG. 10 shows a I/O driver switch circuit according to an embodiment.

FIG. 10 shows an I/O switching circuit 500 including a bias circuit 550 according to an embodiment. Bias circuit 550 includes a controller 532, charge pumps 524, a bias reference stage 528 and a switchable buffer 530 which may be a switchable operational transconductance amplifier 530. The bias reference stage 528 may be implemented for example with bias stage 310 and voltage follower 320 and includes a first bias stage output 526 connected to charge pumps 524 and a second bias stage output connected to the bias circuit output 512 and charge pumps 524. The controller 532 may include a clock multiplexer 540 and an activity detector 542. The activity detector 542 may have an input connected to a clock input 544 of the I/O switching circuit 500 and an enable output 538. The clock multiplexer 540 may have a first and second clock inputs 534, 536 and an output connected to the clock output 548. The multiplexer 540 may have a control input connected to the enable output 538. The switchable buffer 530 which may be an OTA may have an enable input connected to the enable output 538. The switchable buffer 530 may be connected to the first bias stage output 526 and the bias circuit output 512.

The switching circuit 500 may further have a non-overlapping signal generator 546 connected between the switching device clock input 544 and has outputs connected to the switching stage inputs 504-1, 504-2. The switching stage input 504-1 is connected to the level shifter input. The switching stage input 504-2 is connected to the gate of the first NMOS transistor N51. The switching stage may be implemented with cascode arrangement and level shifter similar to switching device 100. The first voltage supply rail 506 is connected to the level shifter 516 and a source of a first PMOS transistor P51. A level shifter output 514 is connected to the gate of the first PMOS transistor P51. Circuit node 508 is connected to a drain of PMOS transistor P51 and source of a second PMOS transistor P52. A second voltage supply rail 518, typically a ground is connected to a source of a first NMOS transistor N51. Node 510 is connected to the drain of the first NMOS transistor N51 and the source of a second NMOS transistor N52. The switch circuit output 502 is connected to a drain of the second PMOS transistor P52 and a drain of a second NMOS transistor N52. A switch voltage supply 520 is connected to the gate of the second NMOS transistor N52. The switch voltage supply has a voltage level Vsw which is less than the voltage of the first supply rail Vsup. In other examples, the switching stage illustrated in switching device 130 may be used.

The non-overlapping signal generator 546 provides the P-drive and N-drive signals for driving PMOS transistor P51 via the level shifter or NMOS transistor N51.

The activity detector 542 may provide respectively the enable signal for the switchable buffer, and/or the frequency selection for the charge pumps 524 at either High Frequency which may be in the MHz range, or low frequency which may be in the kHz range. This may minimize the current consumption when the activity is minimal.

Figure 11:
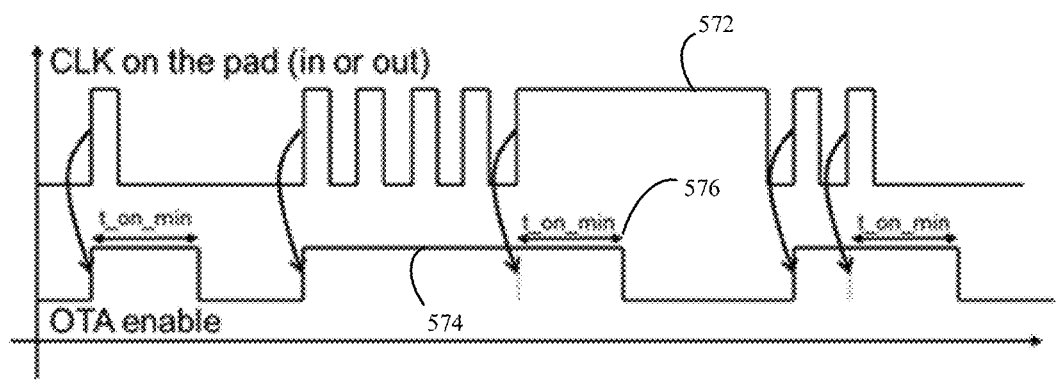
FIG. 11 shows an example enable signal generation for the I/O driver of FIG. 10.

The activity detector 542 may deliver a fixed pulse each time an edge is detected on the IO input clock. In other examples for an input circuit, the activity detector may detect activity on the pad of the integrated circuit. As it may take time for the switchable buffer 530 to turn on, this pulse is in the range of the microseconds. The switchable buffer 530 may then reach a fixed current consumption for an IO clock frequency larger than a few hundreds of kHz for instance. For lower frequencies, the current consumption may be duty cycled. The current consumption may be in the range of a few tens of nA when there is no activity. It reaches the DC consumption of the switchable buffer 530 when the period is smaller than the fixed pulse. An example of the pulse generation waveform 570 is illustrated in the FIG. 11. A clock present on the pad shown in example waveform 572 may trigger the enable signal shown by example waveform 574. The enable signal may be valid for a minimum period 576, denoted t_on_min after each clock edge.

Figure 12:
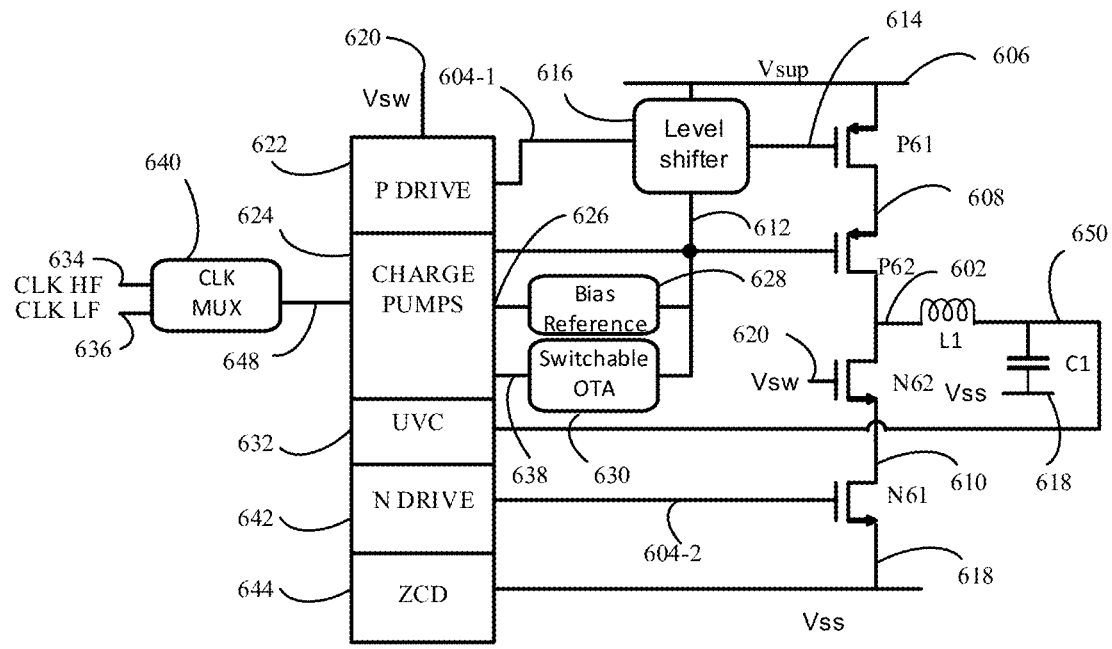
FIG. 12 shows a DC-DC converter including a switch circuit according to an embodiment.

FIG. 12 shows a buck converter 600 including a bias circuit according to an embodiment. Bias circuit includes a clock multiplexer 640 as part of a controller (not shown), charge pumps 624, a bias reference stage 628 and a switchable buffer 630 which may be a switchable operational transconductance amplifier. The bias reference stage 628 may be implemented for example with bias stage 310 and voltage follower 320 and includes a first bias stage output 626 connected to charge pumps 624 and a second bias stage output connected to the bias circuit output 612 and charge pumps 624. The clock multiplexer 640 may have a first and second clock inputs 634, 636 and an output connected to the clock output 648. The multiplexer 640 may have a control input (not shown). The switchable OTA 630 may have an enable input connected to the enable output 638. The switchable OTA 630 may be connected (not shown) to the first bias stage output 626 and the bias circuit output 612.

The switching stage may be implemented with cascode arrangement and level shifter similar to switching device 100. The first voltage supply rail 606 is connected to the level shifter 616 and a source of a first PMOS transistor P61. A level shifter output 614 is connected to the gate of the first PMOS transistor P61. Circuit node 608 is connected to a drain of PMOS transistor P61 and source of a second PMOS transistor P62. A second voltage supply rail 618, typically a ground is connected to a source of a first NMOS transistor N61. The drain of the first NMOS transistor N61 is connected by node 610 to the source of a second NMOS transistor N62. The switch stage output 602 is connected to a drain of the second PMOS transistor P62 and a drain of a second NMOS transistor N62. A switch voltage supply 620 is connected to the gate of the second NMOS transistor N62. The switch voltage supply has a voltage level Vsw which is less than the voltage, Vsup, of the first supply rail 606. An inductor L1 is connected between the switch stage output 602 and the DC-DC converter output 650. A capacitor C1 is connected between the DC-DC converter output 650 and the second supply voltage rail 618. Blocks P-drive 622, N-drive 642, Zero crossing detect (ZCD) 644 and under-voltage comparator (UVC) 632 may be implemented with typical circuits for buck converters. The P-drive output 604-1 may be connected to the input of the level shifter 616. The N-drive output 604-2 may be connected to the gate of NMOS transistor N61. The UVC 632 may be connected to the buck converter output 650. The ZCD 644 may be connected between node 610 and the second supply voltage rail 618 The ZCD detects when the difference between the voltage at node 610 and the second supply voltage rail 618 becomes negative. The measurement is performed in a DC-DC phase when N61 operates in its linear regime. Hence, this differential voltage detection acts as a zero current detection corresponding to the moment when the sign of the current changes from positive to negative. The P drive output is connected to the switching stage input 504-1 connected to the level shifter input. The N drive output is connected to the gate of the first NMOS transistor N61.

Figure 13:
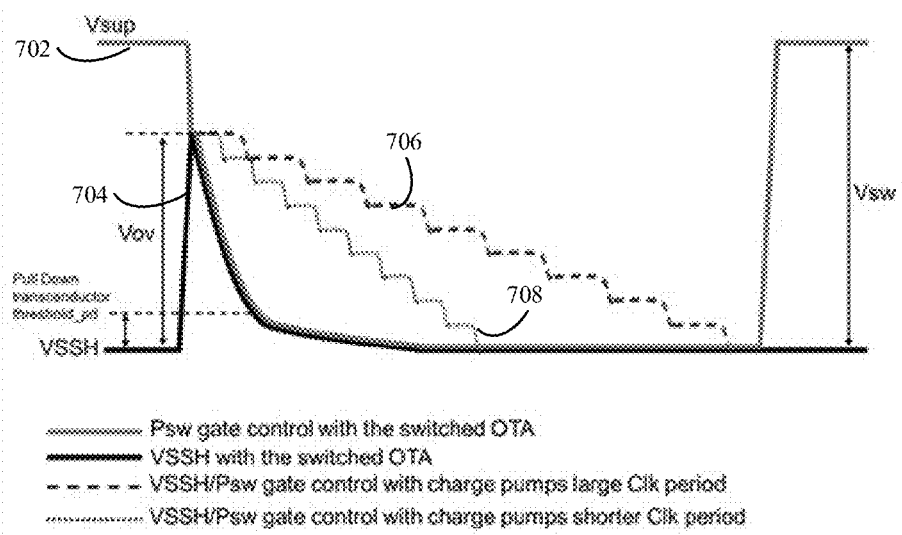
FIG. 13 illustrates a graph showing the effect on the recovery time of the charge pumps and switched buffer.

FIG. 13 illustrates a graph 700 showing the effect on the recovery time of the charge pumps and switched buffer. Line 702 shows the voltage variation at the gate control of transistor P1 of output stage 100. Line 704 shows the initial increase in the value of VSSH and subsequent recovery using and OTA or switched buffer. Lines 706 and 708 show the effect of fast clocking of the charge pumps CP1, CP2 for a faster VSSH recovery. The OTA apparatus remains the fastest one, but it requires some enablement from a switching activity detection block. Charge pumps do not, as they are free running by nature. Note that the charge pumps design may authorize a very fast charge transfer, hence avoid the use of the OTA. However, it requires a clock period several times smaller than the minimum switching activity period, which is not always available.

The detection of the switching activity may have different sources. For example, in a DCDC power converter context, the Finite State Machine indicates when a switching event occurs, and can carry it out to the enable control of the OTA. In an IO context, if the switching signal is internal, then an internal turn-on signal is easy to transport to the edge of the IOs. Note that the charge pumps are always on anyway, as they are zero-quiescent current stages. If the switching signal is external, then a detection machine is necessary.

Embodiments of the bias circuit described may be included in circuits for DC-DC conversion and IOs. However, the bias circuit may be used for any application where a virtual reference voltage such as a virtual ground is necessary and where the behavior of this virtual reference voltage may be predicted. For example, in the particular case of a cascode bias, or gate voltage limiter the bouncing is mostly due to the PMOS switch transistor P1, P51, P61, hence the virtual ground VSSH will tend to increase each time it turns on.

Embodiments of the bias circuit described may provide an efficient way to apply the desired Vgs to a P-type device in a high voltage buck converter. Embodiments of the bias circuit may be used for high voltage IOs, with the addition of an activity sensor to activate/deactivate the OTA to reduce the current consumption when needed.

Embodiments of the bias circuit described may provide an ultra-low power biasing scheme for P-type switching devices (gate-source control for LDMOS or cascoded devices), using low voltage devices. The embodiments may use both a scalable frequency approach and a duty cycled operation to reach almost zero DC quiescent current, while applying a strong voltage drive when needed. The bias circuit may avoid the use of large filtering capacitors and enables the use of large switching devices which is fully integrated i.e. does not require external (off-chip) capacitors.

The term "zero-quiescent current" as used herein refers to a block which consumes a negligible current compared to the total averaged current consumption of the complete system, e.g. only a few % of the total. For example, if the whole system quiescent current target is 1 μA, then a zero-quiescent current block will consume a few nA.

Alternative embodiments to those illustrated may use NMOS instead of PMOS transistors and vice versa.

A bias circuit for generating a virtual reference voltage is described. The bias circuit may bias a switching device configured to switch a switching device output between a first and second supply voltage. The bias circuit includes a bias stage coupled between the first supply voltage rail and the second supply voltage rail. The bias stage has a bias stage output configured to output a virtual reference voltage value having a value between the first and second supply voltage. The bias circuit further includes a voltage follower coupled to the bias stage. The voltage follower is configured to output the virtual reference voltage. The bias circuit further includes a first charge pump coupled to the voltage follower output; and at least one of a second charge pump coupled to the bias stage voltage output, and a switchable buffer coupled to the bias stage voltage output and the voltage follower output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A bias circuit for generating a virtual reference voltage for a switching device configured to switch a switching device output between a first supply voltage and a second supply voltage, the bias circuit comprising:
   a bias stage coupled between a first supply voltage rail and a second supply voltage rail and having a bias stage voltage output configured to output a bias stage voltage having a virtual reference voltage value having a value between the first and second supply voltage;
   a voltage follower coupled to the bias stage and configured to follow the bias stage voltage and having a voltage follower output configured to output the virtual reference voltage;
   a first charge pump coupled to the voltage follower output; and
   at least one of a second charge pump coupled to the bias stage voltage output, and a switchable buffer coupled to the bias stage voltage output and the voltage follower output.

2. The bias circuit of claim 1, wherein the virtual reference value has a value corresponding to the difference between the first supply voltage, and a switch voltage, wherein the switch voltage value is a value between the first and second supply voltage value.

3. The bias circuit of claim 1 comprising the second charge pump.

4. The bias circuit of claim 1 comprising the switchable buffer.

5. The bias circuit of claim 4 wherein the switchable buffer comprises:
   a first switchable buffer input coupled to the bias stage voltage output;
   a second switchable buffer input coupled to the voltage follower output;
   a first and second transconductor stage, each transconductor stage having a first differential input coupled to the first switchable buffer input, and a second differential input coupled to the second switchable buffer input, and a transconductor stage output:
   wherein the first transconductor stage output is coupled to the control input of a MOS transistor having a first terminal coupled to the second switchable buffer input, and a second terminal coupled to the second supply voltage rail; and
   the second transconductor stage output is coupled to the second switchable buffer input.

6. The bias circuit of claim 5 wherein the first transconductor stage comprises an unbalanced differential pair of MOS transistors.

7. The bias circuit of claim 5 wherein each of the first and second transconductor stages further comprises:
   a current mirror having a first current mirror branch and a second current mirror branch, and first and second NMOS transistors having a source coupled to the second supply voltage rail, wherein the second current mirror branch is coupled to the transconductor stage output;
   a differential pair of MOS transistors comprising a first PMOS transistor having a gate coupled to the first differential input and a drain coupled to the first current mirror branch, and a second PMOS transistor having a gate coupled to the second differential input and a drain coupled to the second current mirror branch;
   a third PMOS transistor having a drain coupled to the sources of the first and second PMOS transistors, a source coupled to a switching voltage supply rail, and a gate configured to receive a bias voltage.

8. The bias circuit of claim 5 wherein the switchable buffer further comprises a fourth PMOS transistor having a source coupled to the switching voltage supply rail, a series arrangement of a current source and enable switch coupled between the fourth PMOS transistor gate and drain and the second supply voltage rail.

9. The bias circuit of claim 1, wherein the bias stage further comprises a first series arrangement of at least one diode-connected NMOS transistor coupled between the first supply voltage rail and the bias stage voltage output, and a second series arrangement of at least one diode-connected NMOS transistor coupled between the second supply voltage rail and the bias stage voltage output.

10. The bias circuit of claim 9, wherein the first series arrangement and the second series arrangement comprise the same number of diode-connected NMOS transistors.

11. The bias circuit of claim 9, wherein the first series arrangement and the second series arrangement comprise a different number of diode-connected NMOS transistors.

12. The bias circuit of claim 9 wherein the bias stage further comprises a first bias capacitor coupled between the first supply voltage rail and the bias stage voltage output and a second bias capacitor coupled between the second supply voltage rail and the bias stage voltage output.

13. The bias circuit of claim 9 wherein the voltage follower comprises a voltage follower NMOS transistor having a gate coupled to one of the gates of the first series arrangement of diode-connected NMOS transistors, a source coupled to the voltage follower output and a drain coupled to the first supply voltage rail.

14. The bias circuit of claim 13 further comprising a decoupling capacitor coupled between the voltage follower NMOS transistor and the second supply voltage rail.

15. The bias circuit of claim 1 further comprising a controller coupled to the first charge pump and the second charge pump and configured to generate a clock signal and an enable signal.

16. A switching device comprising the bias circuit of any preceding claim and further comprising a switching stage configured to switch a switching device output between a first supply voltage and a second supply voltage and further comprising:
- a first supply voltage rail configured to supply the first supply voltage;
- a second supply voltage rail configured to supply the second supply voltage;
- a level shifter comprising:
  - a first level shifter input configured to receive an input signal switching between a switch voltage and the second supply voltage;
  - a second level shifter input configured to receive the virtual reference voltage having a virtual reference voltage value corresponding to the difference between the first supply voltage and the switch voltage; and
  - a level shifter output configured to output a voltage varying between the virtual reference voltage and the first supply voltage; wherein the switching device further comprises:
- a PMOS switch transistor having a first PMOS transistor terminal coupled to the first supply voltage rail, a second PMOS transistor terminal coupled to the switching device output and a PMOS control terminal coupled to the level shifter output;
- a NMOS switch transistor having a first NMOS transistor terminal coupled to the second supply voltage rail, a second NMOS transistor terminal coupled to the switching device output and a NMOS control terminal coupled to the first level shifter input.

17. The switching device of claim 16 wherein the gate source voltage of the PMOS and NMOS transistor is less than the switch voltage value.

18. The switching device of claim 16 further comprising a cascode PMOS transistor arranged between the PMOS switch transistor and the switching device output and cascode NMOS transistor arranged between the NMOS switch transistor and the switching device output.

19. A DC-DC converter comprising the switching device of claim 16.

20. An input output (I/O) driver comprising the switching device of claim 16.

* * * * *